(12) United States Patent
Tatoh et al.

(10) Patent No.: US 6,674,143 B2
(45) Date of Patent: Jan. 6, 2004

(54) HERMETICALLY SEALING PACKAGE FOR OPTICAL SEMICONDUCTOR AND OPTICAL SEMICONDUCTOR MODULE

(75) Inventors: Nobuyoshi Tatoh, Itami (JP); Kenichiro Shibata, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 13 days.

(21) Appl. No.: 10/093,734

(22) Filed: Mar. 11, 2002

(65) Prior Publication Data

US 2002/0179989 A1 Dec. 5, 2002

(30) Foreign Application Priority Data

May 30, 2001 (JP) ........................................ 2001-162393

(51) Int. Cl.$^7$ .......................................... H01L 31/0203
(52) U.S. Cl. ...................... 257/434; 257/431; 257/432; 257/433; 250/216; 250/239
(58) Field of Search .................... 257/434, 431–433, 257/435; 250/216, 239

(56) References Cited

U.S. PATENT DOCUMENTS

| | | | |
|---|---|---|---|
| 4,355,321 A | | 10/1982 | Yeats |
| 5,132,532 A | * | 7/1992 | Watanabe .................. 250/239 |
| 2002/0003819 A1 | * | 1/2002 | Kimura et al. ................ 372/36 |

FOREIGN PATENT DOCUMENTS

| | | | |
|---|---|---|---|
| EP | 0 404 053 A2 | | 12/1990 |
| EP | 0691555 A1 | | 1/1996 |
| EP | 0 895 110 A2 | | 12/1996 |
| JP | 6-151629 | | 5/1994 |
| JP | 406318647 A | * | 11/1994 |
| JP | 8-148594 | | 6/1996 |
| JP | 10-173079 | | 12/1996 |
| JP | 2620287 | | 3/1997 |
| JP | 2620288 | | 3/1997 |
| JP | 10-316466 | | 12/1998 |
| JP | 11-54642 | | 2/1999 |

* cited by examiner

*Primary Examiner*—David L. Talbott
*Assistant Examiner*—Luan Thai
(74) *Attorney, Agent, or Firm*—McDermott, Will & Emery

(57) ABSTRACT

A hermetically sealing package for an optical semiconductor equipped with a light transmitting window whose light transmitting surface is inclined at least six degrees from the vertical line of the package bottom plate and which is joined to a cylindrical component on the package side wall by the use of a solder brazing material, in which the window material is made of a light-transmitting ceramic (such as alumina or spinel) plate in a substantially regular hexagonal or disk form in which a metallized portion is formed around the periphery, leaving a circular light transmitting portion in the center of the plate; and an optical semiconductor module that makes use of the package. The hermetically sealing package and the optical semiconductor module are easy and inexpensive to manufacture, have high reliability, and do not deform the plane of polarization.

6 Claims, 2 Drawing Sheets

HERMETICALLY SEALING PACKAGE FOR OPTICAL SEMICONDUCTOR AND OPTICAL SEMICONDUCTOR MODULE

BACKGROUND OF THE INVENTION

1. Field of the Invention

The present invention relates to a package for hermetically sealing an optical semiconductor equipped with a light transmitting window and for housing an optical semiconductor element in its interior, and to an optical semiconductor module that makes use of this optical semiconductor hermetic sealing package.

2. Description of the Prior Art

The hermetic sealing of an optical semiconductor module is considered very important in optical communications in order to ensure high reliability. This is because the electrodes of an optical semiconductor element will deteriorate under high temperature and humidity, and because moisture that finds its way into the package will condense and diminish the optical characteristics, so the service life of an optical semiconductor element cannot be guaranteed for more than 10 years.

Meanwhile, with an optical semiconductor module, the optical semiconductor element inside the package must be optically linked to an optical fiber on the outside. In view of this, a light transmitting window structure is employed in an optical semiconductor hermetically sealed package in order to optically link the optical semiconductor element on the inside of the package with the optical fiber on the outside while still maintaining the airtightness of the package.

Japanese Patent Application Laid-Open H6-151629 discloses the use of sapphire for a light-transmitting window. Because of its excellent light-transmission and high strength, sapphire is often used in the housings (hermetically sealing packages) of optical semiconductor modules. This sapphire is worked with a drill into a circular shape.

Japanese Patent Application Laid-Open H11-54642 proposes a window structure for an optical semiconductor module, which makes use of a substantially regular hexagonal piece of borosilicate glass for the window. Borosilicate glass is less expensive and has better transmission than sapphire, and it is an isotropic material and does not bring about birefringence. Stress from heat and so on causes elastic strain, which deform the plane of polarization, but it has been found that if the stress is applied uniformly to the glass, as discussed in Japanese Patent Application Laid-Open H11-54642, then the polarization extinction ratio will be reduced (about −40 dB) that any significant problem will not arise. Also, a regular hexagonal shape allows a low-cost dicing process to be used, so another benefit is the reduced cost of the window material. Unfortunately, a drawback is that borosilicate glass is low in strength, and care must be taken when it is to be used under harsher conditions.

The deformation of the plane of polarization is generally expressed by the polarization extinction ratio. In a crossed Nicol prism experimental system, a polarizer on the light-emitting side is rotated 90 degrees relative to that of the light-incoming side, the maximum light intensity is termed Imax and the minimum light intensity Imin, and the polarization extinction ratio is defined as $10 \times \log_{10}$ (Imin/Imax).

Reducing the cost of an optical semiconductor module is of great importance in modern optical communications. This calls for improvement to the window material for a hermetically sealing package that serves as the housing for the optical semiconductor module. However, drill cutting is required to work sapphire crystals into a circular shape as in the above-mentioned Japanese Patent Application Laid-Open H6-151629, and in the course of this working the window material may be scratched or otherwise damaged, which lowers the yield, and this drives up the cost.

As high-density wavelength-multiplexing technology and technology for raising speed have become more sophisticated, it has become imperative that the plane of polarization of the light be maintained and that wavelength uniformity be obtained. To achieve the latter of these two goals it is preferable to form an external resonator structure, such as an optical fiber grating, through a fiber in addition to the hermetically sealing package, but here again it is necessary to maintain the plane of polarization of the light. If this is expressed as the polarization extinction ratio of the intensity level, stringent conditions in which Imax is at least 1000 times Imin (e.g. −30 dB) become necessary. Because of insufficient satisfactory results obtained in Japanese Patent Application Laid-Open H11-54642, the use of the structure proposed therein has still been shunned in fields that require extremely high reliability such as undersea cables.

SUMMARY OF THE INVENTION

The present invention was conceived in light of this situation, and it is an object thereof to provide an optical semiconductor hermetic sealing package and an optical semiconductor module that are easy and inexpensive to manufacture, have high reliability, and do not cause the deformation of the plane of polarization.

To achieve the stated object, the present invention provides a hermetically sealing package for an optical semiconductor equipped with a light transmitting window whose light transmitting surface is inclined at least six degrees from the vertical line of the package bottom plate and which is joined to a cylindrical component on the package side wall by the use of a solder brazing material, wherein the window material consists of a light-transmitting ceramic plate in which a metallized portion is formed around the periphery, leaving a circular light transmitting portion in the center of the plate. The present invention further provides a hermetically sealing package for an optical semiconductor in which the plate is made of a sintered body of an oxide containing aluminum (such as alumina or spinel). Methods for manufacturing a light-transmitting spinel sintered body have been disclosed in Japanese Patents 2620287 and 2620288.

The present invention provides an optical semiconductor module having an optical semiconductor element inside the above-mentioned optical semiconductor hermetic sealing package of the present invention, and an optical fiber outside the same package.

Since a light-transmitting ceramic is easier to work than sapphire, a disk can be easily produced by drilling, which helps lower the cost. Also, this material can be easily diced into a regular hexagonal shape, just as with borosilicate glass.

A regular hexagonal shape affords the highest yield when low-cost dicing is performed. The yield is even higher than with conventional drilling because the tip of a dicing blade is smaller than a drill tip. An adhesive wafer sheet can be used with dicing, so there is no chip scattering, and window materials can be produced at a higher yield, so the cost is lower.

With monoaxial crystals such as sapphire, birefringence does not occur if the optical axis is aligned with the C-axis of the crystals. If the incident light is linearly polarized light, the C-axis will lie within the plane of polarization, and no birefringence will occur. To ensure a polarization extinction ratio of −30 dB, which is what is required in the field of optical communications, the plane of polarization must be aligned with the C-axis plane. A large polarization extinction ratio is a source of loss and noise. If the window material is made from a sintered body of a light-transmitting ceramic, however, it will be in a polycrystalline state (a collection of minute crystals) and will be optically isotropic, and deformation of the plane of polarization when light passes through can be eliminated regardless of the orientation of the window material. Accordingly, an optical semiconductor hermetic sealing package can be easily produced without any positioning, which affords a lower cost.

The optical semiconductor hermetic sealing package of the present invention can be used to produce an optical semiconductor module that is low in cost and high in reliability, and with which there is no deformation of the plane of polarization.

BRIEF DESCRIPTION OF THE DRAWINGS

FIGS. 2a and 2b are plan views of the light-transmitting ceramic plates that serve as window materials used in the present invention in which FIG. 2a shows a hexagonal window and FIG. 2b a disk-shaped window.

DETAILED DESCRIPTION OF THE PREFERRED EMBODIMENTS

The optical semiconductor hermetic sealing package of the present invention will be described through reference to the drawings.

Figure 1:
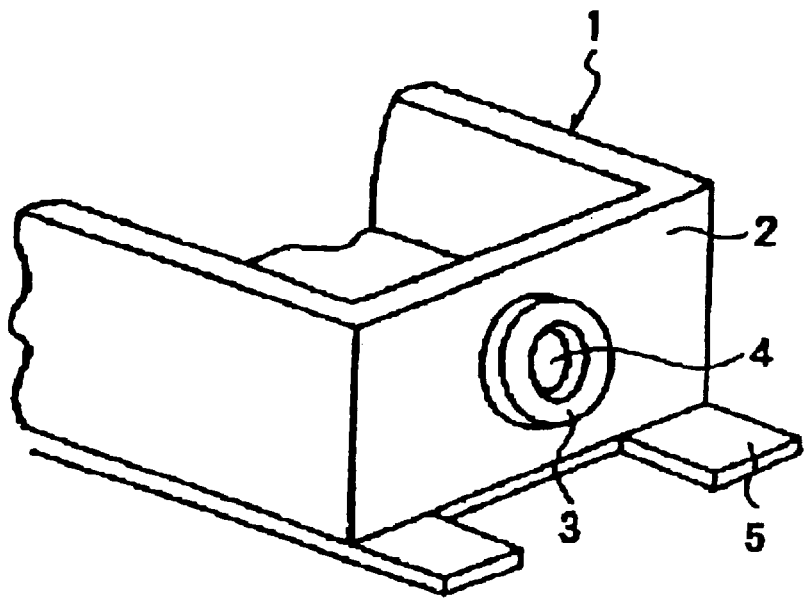
FIG. 1 is a simplified perspective view illustrating an example of the light transmitting window of the optical semiconductor hermetic sealing package of the present invention.
Figures 2A, 2B:
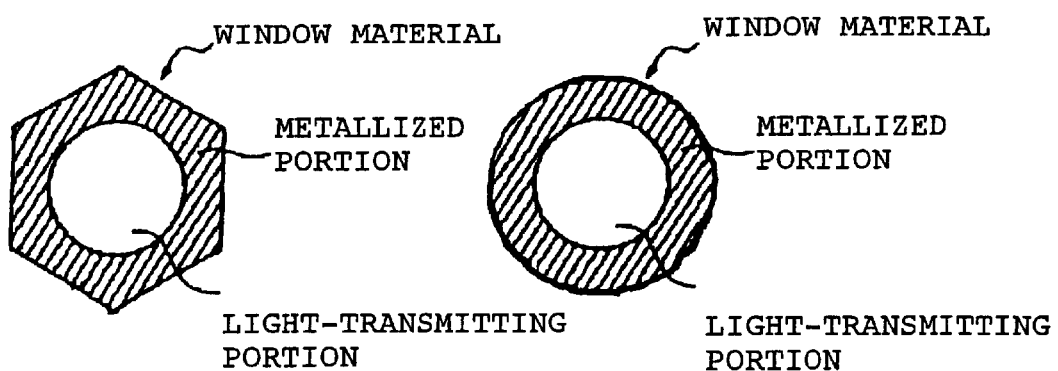
Figure 3:
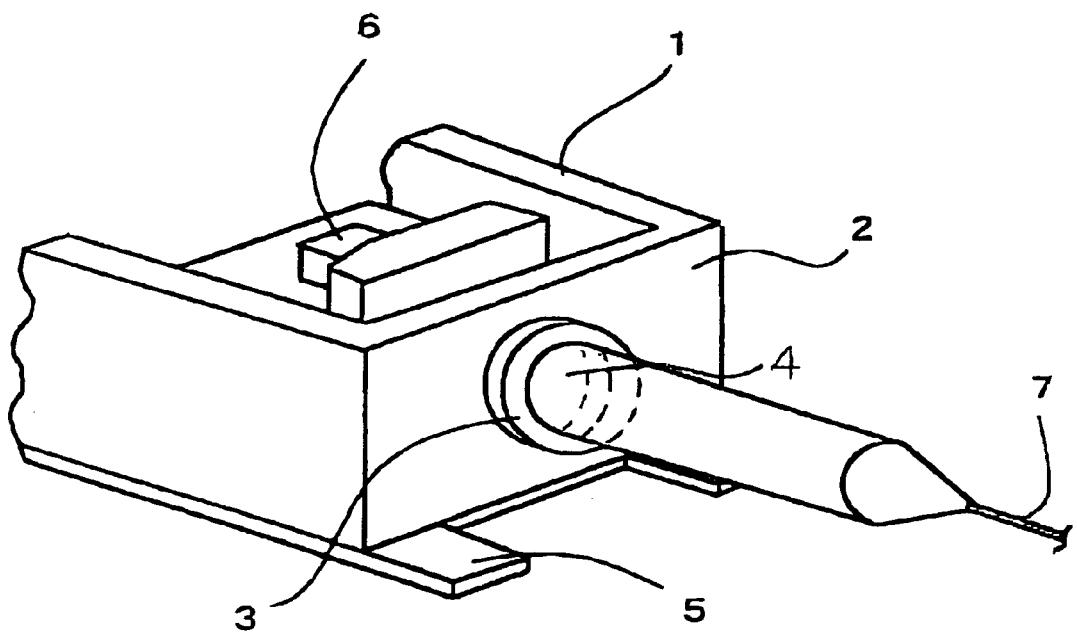
FIG. 3 is a simplified perspective view illustrating an example of an optical semiconductor module in accord with the present invention in which an optical semiconductor element and an optical fiber are disposed on the inside and on the outside, respectively, of the hermetically sealing package shown in FIG. 1.

FIG. 1 is a simplified perspective view illustrating an example of the light-transmitting window of the optical semiconductor hermetic sealing package of the present invention. FIGS. 2a and 2b are plan views of the light-transmitting ceramic plates that serve as the window material, in which FIG. 2a shows a hexagonal window material and FIG. 2b a circular window material. A cylindrical component 3 is fitted in and brazed to a through-hole in a package side wall 2 of a hermetically sealing package 1, and this is then subjected to gold plating or other similar treatments to produce an intermediate package product. 5 is a bottom plate. A window material 4 is joined to this cylindrical component 3 to constitute a light-transmitting window. In the present invention, as shown in FIG. 2a or FIG. 2b, the window material 4 consists of a light-transmitting ceramic plate, in the form of a substantially regular hexagonal plate or a disk, in which a metallized portion is formed around the periphery, leaving a circular light transmitting portion in the center. If this plate is made from a sintered body of an oxide containing aluminum (such as alumina or spinel), then the window material will be optically isotropic and deformation of the plane of polarization when light passes through can be eliminated regardless of the orientation of the window material, which affords a cost reduction.

Among the various light-transmitting ceramics available, sintered bodies of an oxide containing aluminum (such as alumina or spinel) have particularly high strength and provide window materials that will have better durability than one made of borosilicate glass. Another advantage is that these oxide ceramics allow the metallization (Ti/Pt/Au, etc.) required for brazing.

Furthermore, these oxide ceramics afford a percent light transmission which is the most important optical characteristic for the window materials, of at least 95%, and preferably at least 98%, through mirror polishing and AR (antireflection) coating (e.g. MgF) at a practical thickness of about 0.3 mm.

An optical semiconductor module can be produced using the above-mentioned optical semiconductor hermetic sealing package by connecting an optical semiconductor element 6 on the inside of this package and an optical fiber 7 on the outside of the same package.

EXAMPLE 1

An optical semiconductor hermetic sealing package was produced by silver brazing, using Kovar for the bottom plate, Kovar for the side walls, and Kovar also for the cylindrical pipe for the light transmitting window. For terminals, Kovar pins were sealed with low-melting point glass and plated with nickel or gold. In order to fit a light-transmitting ceramic (spinel sintered body) plate into the side wall, a pipe having an angled surface of at least six degrees with respect to the side wall was silver brazed such that the angled surface of at least six degrees was within five degrees of the plane of polarization. Actually, a cylindrical hole was made in the side wall, a cylindrical pipe was fitted into the hole, and this pipe was positioned with a carbon jig. The window was subjected to an AR coating of MgF. This coating may be a multilayer film of TiO and SiO. The metallization on the light-transmitting ceramic was Ti/Pt/Au, starting from the light-transmitting ceramic side. Dicing was employed for the working of the light-transmitting ceramic (spinel sintered body). The metallization strength here was increased by not applying metallization along the dicing lines. The light-transmitting ceramic (spinel sintered body) was hermetically joined to the housing with an AuSn brazing material. The use of this window material halved the cost of thereof.

Because a polycrystalline material composed of a collection of minute crystals of a light-transmitting ceramic (spinel sintered body) was used as the window material and the window was optically isotropic, the angle of the window has no relation with birefringence, so the polarization extinction ratio was −30 dB or less regardless of the angle. Accordingly, there was no need for high precision pipe alignment. This afforded a 10% increase in yield and furthermore allowed the cost to be reduced.

EXAMPLE 2

A PANDA fiber (Polarization AND Attenuation reducing optical fiber) was connected to an optical semiconductor module having the window structure of Example 1, which allowed light to propagate while the linear polarization was maintained at a high level. In this case, a plurality of beams of excited light required for an optical fiber amplifier were polarized and synthesized, allowing the optical fiber amplifier to be used more efficiently. It was also possible to simplify the structure of the isolator, which provided further reduction in cost.

EXAMPLE 3

A modulator module was produced from LN ($LiNbO_3$), which is an anisotropic optical material, using the package of Example 1. The modulator module thus produced made use of Mach-Zehnder elements. Because the polarization extinction ratio of the window was low, it was possible to suppress the birefringence produced inside the LN modulator, allowing an optical signal with a good S/N (Signal-to-Noise) ratio to be obtained.

EXAMPLE 4

The window structure of Example 1 was used for a semiconductor laser, which suppressed optical loss in the isolator connected to the outside of the window.

EXAMPLE 5

Polarization dependence was a problem with a semiconductor photoamplifier, but linearly polarized light was obtained with a λ/4 (quarter wavelength) plate, after which it was possible to enhance the amplification characteristics with a module using a housing equipped with the window structure as in Example 1. This reduced the insertion loss of light-light switching elements capable of high speed operation or wavelength conversion elements in which a semiconductor amplifier was used, allowing an optical signal with a good S/N ratio to be obtained.

EXAMPLE 6

An antireflection mechanism that selectively reflected specific wavelengths, such as a fiber grating, was provided to the outside of the package of Example 1, which resulted in resonance with the optical element inside the housing. It was possible to suppress disturbance in the oscillation mode brought about by the birefringence of the window here, and an optical semiconductor module with excellent wavelength selectivity could be provided. Also, light signal loss was small and light intensity was increased.

The present invention provides an optical semiconductor hermetic sealing package having a window structure that is easy and inexpensive to manufacture, that offers high reliability, and that does not result in breakage of the plane of polarization. Also, use of an optical semiconductor hermetic sealing package that employs this window provides an optical semiconductor module with high optical intensity and excellent mode stability.

What is claimed is:

1. A hermetically sealing package for an optical semiconductor equipped with a light transmitting window whose light transmitting surface is inclined at least six degrees from the vertical line of a package bottom plate and which is joined to a cylindrical component on a package side wall by the use of a solder brazing material, in which a window material is made of a light-transmitting ceramic plate of a sintered body comprising as a main component a light-transmitting spinel ($MgAl_2O_4$), in which a metallized portion is formed around the periphery, leaving a circular light transmitting portion in a central part of the plate.

2. The hermetically sealing package according to claim 1, in which the plate is a sintered body of an oxide containing aluminum (Al).

3. The hermetically sealing package according to claim 2, in which the sintered body comprises as a main component a light-transmitting alumina ($Al_2O_3$) or a light-transmitting spinel ($MgAl_2O_4$).

4. The hermetically sealing package according to claim 1, in which the light transmitting portion in the central part of the window is provided with an antireflection coating and has a percent transmission of at least 95%.

5. The hermetically sealing package according to claim 1, in which the window material is in the form of a disk or a substantially regular hexagonal plate.

6. An optical semiconductor module comprising a hermetically sealing package for an optical semiconductor which has an optical semiconductor element on the inside and an optical fiber on the outside, in which the hermetically sealing package is equipped with a light transmitting window whose light transmitting surface is inclined at least six degrees from the vertical line of a package bottom plate and which is joined to a cylindrical component on a package side wall by the use of a solder brazing material and in which a window material is made of a light-transmitting ceramic plate of a sintered body comprising as a main component a light-transmitting spinel ($MgAl_2O_4$), in which a metallized portion is formed around the periphery, leaving a circular light transmitting portion in a central part of the plate.

* * * * *

UNITED STATES PATENT AND TRADEMARK OFFICE
CERTIFICATE OF CORRECTION

PATENT NO. : 6,674,143 B2
DATED : January 6, 2004
INVENTOR(S) : Nobuyoshi Tatoh et al.

It is certified that error appears in the above-identified patent and that said Letters Patent is hereby corrected as shown below:

<u>Column 6,</u>
Delete claims 2 and 3;
Renumber claims "4, 5 and 6" to -- 2, 3 and 4 --.

Signed and Sealed this

Fourteenth Day of December, 2004

JON W. DUDAS
*Director of the United States Patent and Trademark Office*